Figure 1:
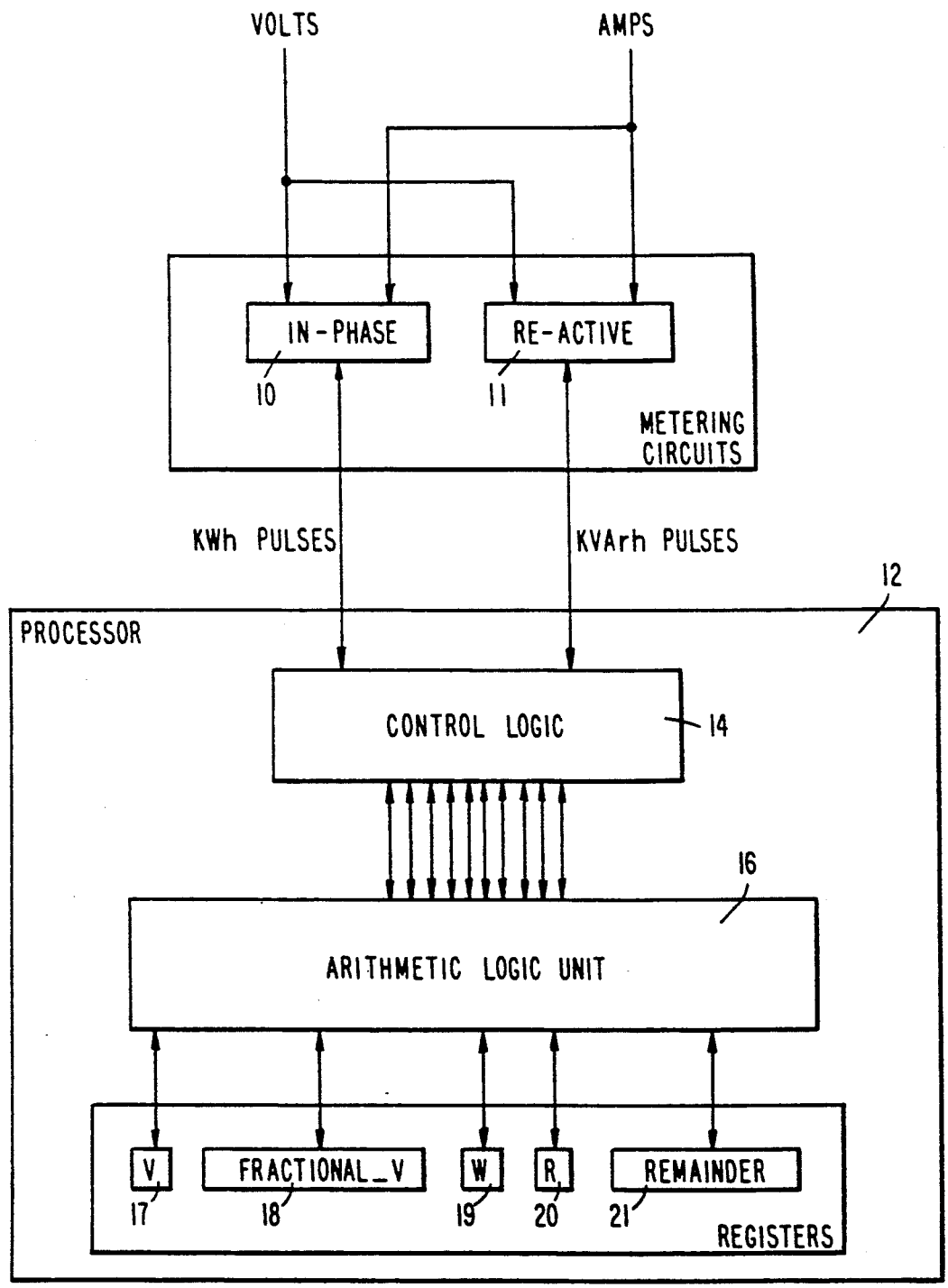

United States Patent [19]

Clarke et al.

[11] Patent Number: 5,146,157
[45] Date of Patent: Sep. 8, 1992

[54] CALCULATION APPARATUS FOR AN ELECTRONIC METER

[75] Inventors: David J. Clarke, Bramford; Michael D. Hutchinson, Ipswich, both of England

[73] Assignee: Schlumberger Industries Limited, Farnborough, England

[21] Appl. No.: 635,033

[22] Filed: Dec. 28, 1990

[30] Foreign Application Priority Data

Jan. 4, 1990 [GB] United Kingdom ............... 9000179

[51] Int. Cl.$^5$ ............... G01R 11/16; G01R 19/00
[52] U.S. Cl. ............... 324/142; 324/107; 324/141; 364/483
[58] Field of Search ............ 324/142, 103 R, 115–116, 324/141, 107; 364/483, 492, 841, 842; 340/657, 661; 328/160; 307/261

[56] References Cited

U.S. PATENT DOCUMENTS

| | | | |
|---|---|---|---|
| 4,257,004 | 3/1981 | Miller | 324/141 |
| 4,454,471 | 6/1984 | Schwendtner et al. | 324/141 |
| 4,837,504 | 6/1989 | Baer et al. | 324/142 |
| 4,902,965 | 2/1990 | Bodrug et al. | 324/142 |

FOREIGN PATENT DOCUMENTS 0296967 12/1988 European Pat. Off. .

*Primary Examiner*—Vinh Nguyen
*Attorney, Agent, or Firm*—Sanford J. Asman

[57] ABSTRACT

Separate pulse inputs from respective metering circuits, representing the reactive R and in-phase W power components, are converted to a pulse output V representing the vector sum of those components. The two inputs are applied to increment respective registers, the output V is held in a third register, and a fourth register is provided to store the REMAINDER value $(W^2 + R^2) - (V+1)^2$. The meter includes a processor for incrementing the REMAINDER value by $2W+1$ for each increment of W and $2R+1$ for each increment of R and for incrementing V whenever the REMAINDER value is zero or positive and at the same time reducing the REMAINDER value by $2V_1+1$, where $V_1$ is the incremented value of V. The FRACTIONAL error in the value of V is determined by means of a look-up table.

3 Claims, 3 Drawing Sheets

CALCULATION APPARATUS FOR AN ELECTRONIC METER

The present invention relates to an electronic meter for measurement of power in an electricity supply system. The problems of conventional electro-mechanical electricity meters and some proposals for electronic meters are discussed in the introductory part of European patent specification EP-A2-0296967. The invention described in that specification is an amplifier for a voltage or current to frequency converter which is applicable to a power meter for a polyphase system. The power meter described takes input signals representing voltage and current, multiplies then together, and generates a pulsed output representing power consumption. This output can then be applied to drive a digital or analogue display device.

The system described in EP-A2-0.296967 assumes that for each phase the voltage and current are in phase, or looking at it another way it measures only the in-phase component of the power or kWh, where $W(Watts)=V(Volts) \times I(Amps)$. There is also to be considered the reactive component of the power i.e. kVArh. Further it is common for billing to be based on kVAh, i.e. the vector sum of these in-phase and reactive components. Thus $$(kVAh)^2 = (kWh)^2 + (kVArh)^2$$

or, for simplicity, this can be represented by $$V^2 = W^2 + R^2$$

When W and R are supplied in the form of pulse signals, for example from two circuits of the kind described in EP-A2-0296967, there is a difficulty in calculating an accurate value of the vector sum V without doing complex calculations.

In accordance with the present invention there is provided an electronic power meter in which separate pulse inputs representing the reactive R and in-phase W power components are converted to a pulse output V representing the vector sum of those components, wherein the two inputs are applied to increment respective registers, the output V is held in a third register, and a fourth register is provided to store the REMAINDER value $(W^2+R^2)-(V+1)^2$, the meter including a processor for incrementing the REMAINDER value by $2W+1$ for each increment of W and $2R+1$ for each increment of R and for incrementing V whenever the REMAINDER value is zero or positive and at the same time reducing the REMAINDER value by $2V_1+1$, where $V_1$ is the incremented value of V.

The result of this operation is that the new REMAINDER value is $$[(W+1)^2+R^2]-(V_1+1)^2 \text{ or}$$
$$[W^2+(R+1)^2]-(V_1+1)^2$$

according to whether W or R increased by one increment.

The basis of the operation of the processor with the three registers is simply that $$(W+1)^2 = W^2+2W+1 \text{ and } (R+1)^2 = R^2+2R+1$$

Thus for each increment of W or R, the increment in $W^2$ is $2W+1$ and in $R^2$ is $2R+1$ and these increments can be applied to the REMAINDER value. With the power signals in digital form the value of V is given by $$V^2 \leq (W^2+R^2) \text{ and } (V+1)^2 > (W^2+R^2)$$

Thus the REMAINDER value $(W^2+R^2)-(V+1)^2$ should always be negative and V must be incremented when the REMAINDER value reaches zero or goes positive. When this happens, i.e. V is incremented to $V_2 = V+1$, then again because $[(V+1)+1]^2 = (V+1)^2 + 2(V+1)+1$ the REMAINDER is decremented by $2(V+1)+1$ or $2V_1+1$.

Thus in accordance with the invention the increasing digital value of V can be determined at all times by a procedure which involves no more than simple addition or subtraction of values in the four registers. However variations in the phase angle of the load over a long period of integration can lead to errors and it is therefore desirable to restart the integration period more frequently.

Using an integration period of a fixed length and reducing that length will produce a wide spread of errors dependent upon the number of pulses counted during the time period. Accordingly the integration period is terminated whenever either R or W has increased by a predetermined count.

The shortening of the integration period in this way increases the significance of the truncation errors, making it more necessary to correct FRACTIONAL errors in V. For this purpose a look-up table is used at the end of each integration period to supply the FRACTIONAL error. The look-up table contains the FRACTIONAL values of the vector sum corresponding to each value of W or R, respectively, less than the predetermined count of R or W at which the integration period is terminated.

In theory the look-up table can provide the digital and FRACTIONAL parts of the required vector sum but in practice this could give changes of several integers in the vector sum and to avoid this the two methods of calculation are used in parallel to give a progressively increasing digital value accompanied by an accurate FRACTIONAL value determined whenever the number of W or R pulses reaches a small limit value. The FRACTIONAL errors are stored in an accumulator and when the accumulated errors exceed 1 an extra V pulse is added to the output where otherwise none would have been produced and at the same time the stored FRACTIONAL error sum is reduced by 1.

An example of a power meter in accordance with the invention will now be described with reference to the accompanying drawings, in which FIG. 1 is a block circuit diagram of the meter, and FIGS. 2A and 2B constitute a partial flow chart for the processing of signals by the meter.

As seen at the top of FIG. 1 the input to the meter is in the form of signals representing the voltage and current (Amps), whose in-phase and re-active components are separately measured by the metering circuits 10 and 11. The output from the in-phase metering circuit 10 is in the form of pulses representing kWh, or in the short form used above W, while the output from the re-active metering circuit 11 is in the form of pulses representing kVArh or R. The pulse signals W and R are fed to a processor 12 which generates the required pulse output V. The processor 12 includes control logic 14, an arithmetic logic unit 16 and registers 17, 18, 19, 20 and 21 in which, respectively, the values of V, FRACTIONAL V, W, R, and the REMAINDER are held, as will be described below.

Figure 2A:
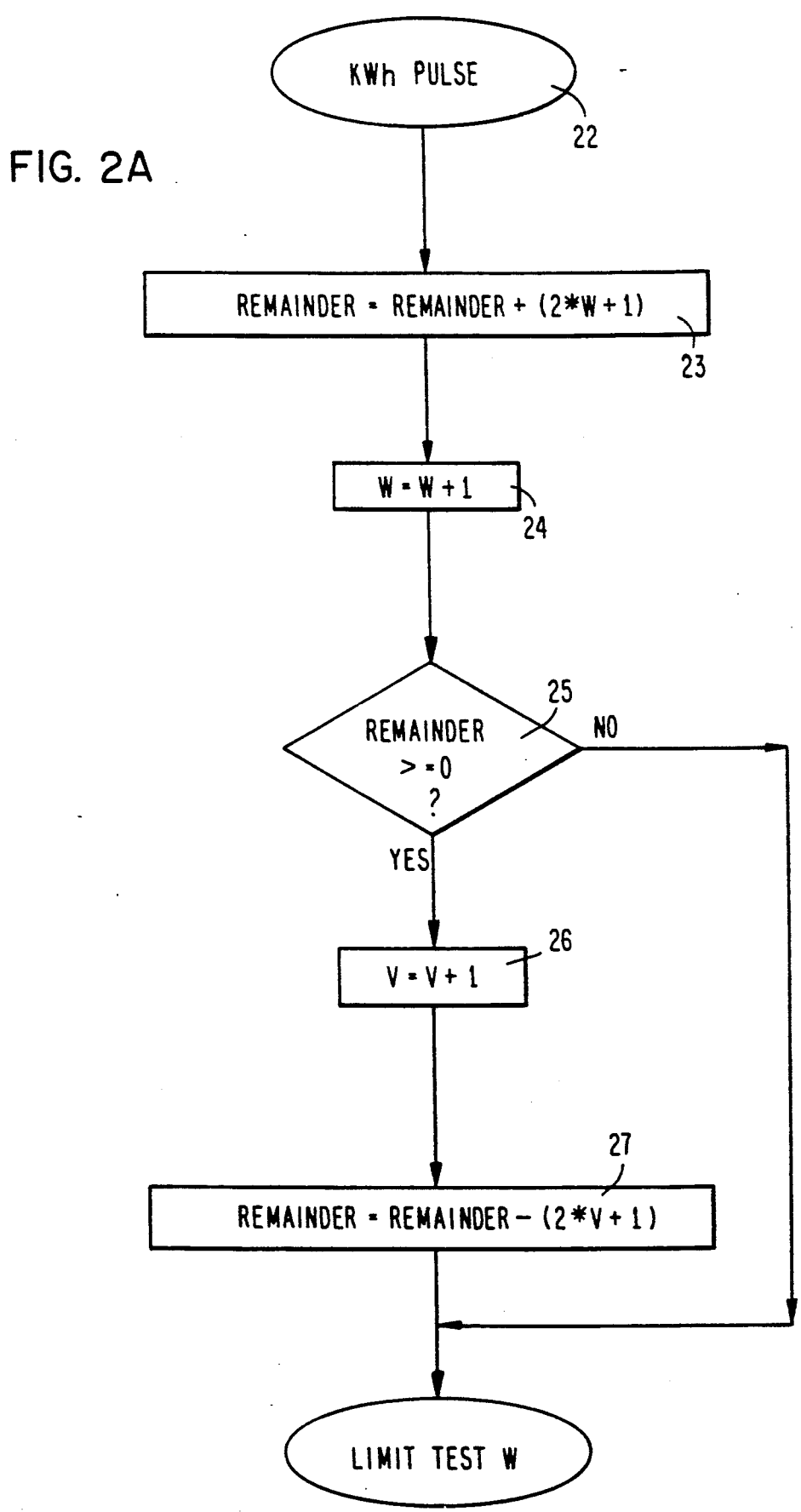
Figure 2B:
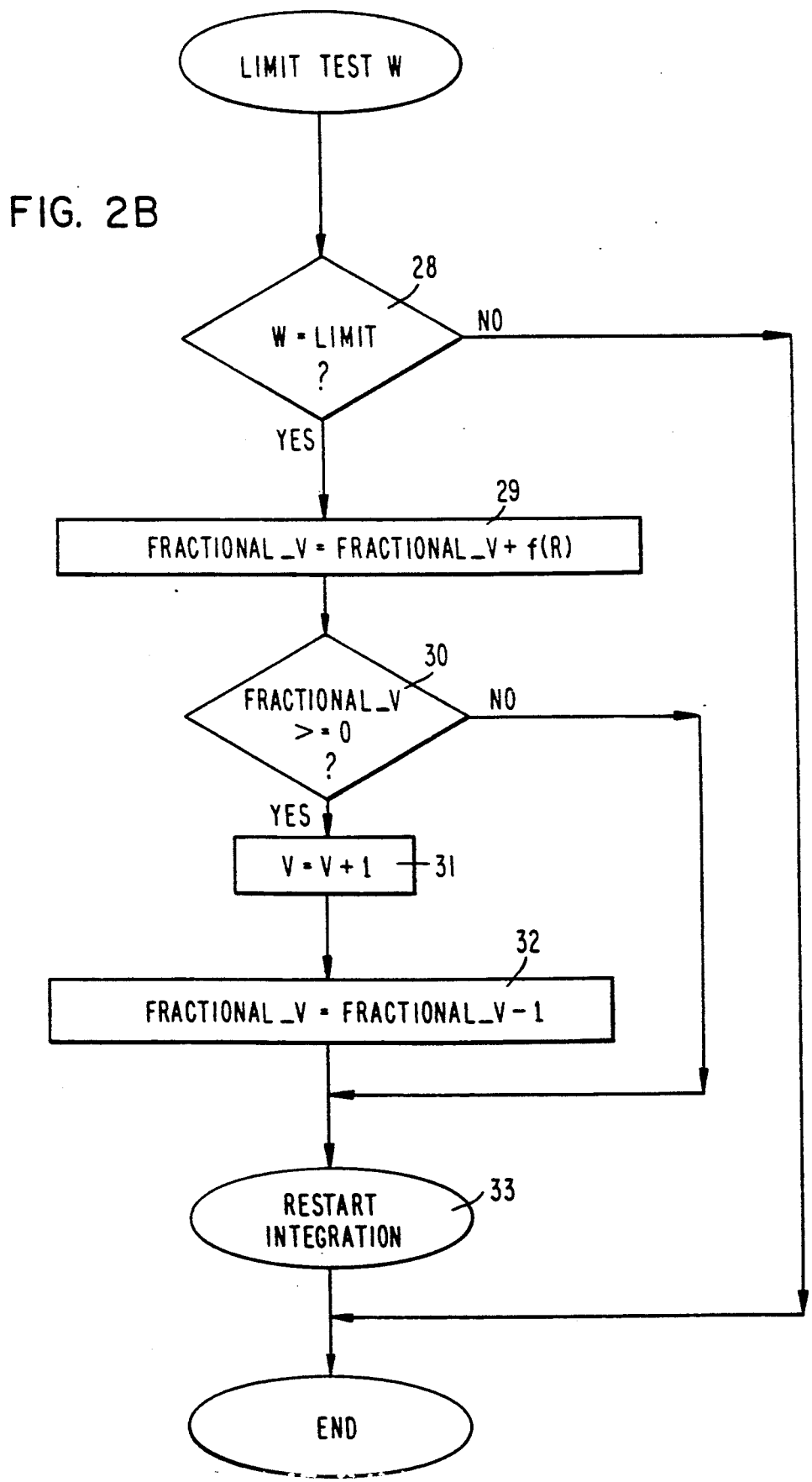

FIGS. 2A and 2B show the handling of the kWh pulses by the processor 12. The stages in the flow chart are represented in what follows by bracketed reference numerals. An exactly parallel flow chart would represent the handling of the kVArh pulses.

On receipt of a kWh pulse (22) the remainder in register 21 is incremented (23) by (2W+1), using the W value in register 19. Register 19 is then incremented (24) by one. The REMAINDER value is checked (25) to determine whether it is greater than or equal to zero and if so V is incremented (26) by one. The REMAINDER value is then decremented (27) by (2V+1). In the case when the REMAINDER is less than zero stages 26 and 27 are by-passed.

Passing then to FIG. 2B the value of W is tested (28) to see whether the number of pulses received has reached a pre-set limit. If not, the processor continues to handle each new pulse which arrives in the same way until the limit value of W is reached. Then the fractional value of V in register 18 is up-dated (29) by reference to the current values of W and R and the incremented fractional value is checked (30) to determine whether it is equal to or greater than zero. If yes, the value of V is incremented (31) by one and the value of FRACTIONAL V is decremented (32) by one. If FRACTIONAL V is already less than zero stages 31 and 32 are bypassed. Integration is now re-started (33) by setting the registers 17, 19, 20 and 21 for V, W, R, and REMAINDER to zero.

At the same time, of course, kWArh pulses are being processed in an exactly parallel manner with V being incremented and the remainder values adjusted until R reaches its pre-set limit, the fractional V values are adjusted and the integration is restarted, the registers then being re-set as before.

We claim:

1. Calculation apparatus for an electronic power meter comprising:
    (a) first means for receiving input pulses representing a reactive component, R from a first metering circuit;
    (b) second means for receiving input pulses representing an in-phase power component, W, from a second metering circuit;
    (c) means for processing said input pulses representing said reactive component, R, and said input pulses representing said in-phase power component, W, into a pulse output, V, representative of the vector sum of said input pulses, said means for processing comprising a first register for accumulating said input pulses R, a second register for accumulating said input pulses W, and a third register for retaining said output pulses V, and a fourth register which stores the remainder $(W^2+R^2)-(V+1)^2$, said means for processing further comprising incrementing means for incrementing said remainder value by $2W+1$ for each increment of W and $2R+1$ for each increment of R, said incrementing means incrementing V whenever said remainder value is zero or positive and reducing the value of said remainder value by $2V_1+1$, where $V_1$ is the incremented value of V.

2. The calculation apparatus of claim 1 in which V is reset to zero by said incrementing means, and the calculation of V is restarted whenever the value of R or W has increased by a predetermined count.

3. The calculation apparatus of claim 1 wherein said means for processing further comprises fractional error determining means for determining the fractional error in V comprising a look-up table which may be interrogated by incrementing means whenever the value of R or W has increased by a predetermined count, said look-up table providing said incrementing means with the frictional error in the vector sum corresponding to each value of W or R, respectively, less than that count.

* * * * *